(12) United States Patent
Wang et al.

(10) Patent No.: US 11,909,373 B2
(45) Date of Patent: Feb. 20, 2024

(54) BULK ACOUSTIC RESONATOR STRUCTURES WITH IMPROVED EDGE FRAMES

(71) Applicant: Global Communication Semiconductors, LLC, Torrance, CA (US)

(72) Inventors: Shing-Kuo Wang, Torrance, CA (US); Liping D. Hou, Torrance, CA (US); Kun-Mao Pan, Harbor City, CA (US); Andy Chien-Hsiang Chen, Cypress, CA (US); Robert B. Stokes, Rancho Palos Verdes, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 761 days.

(21) Appl. No.: 17/071,849

(22) Filed: Oct. 15, 2020

(65) Prior Publication Data
US 2021/0111702 A1   Apr. 15, 2021

Related U.S. Application Data

(60) Provisional application No. 62/915,577, filed on Oct. 15, 2019, provisional application No. 62/915,588, (Continued)

(51) Int. Cl.
*H03H 9/02* (2006.01)
*H03H 9/13* (2006.01)
(Continued)

(52) U.S. Cl.
CPC ...... *H03H 9/02015* (2013.01); *H03H 9/0211* (2013.01); *H03H 9/02102* (2013.01);
(Continued)

(58) Field of Classification Search
CPC ........... H03H 9/02015; H03H 9/02102; H03H 9/0211; H03H 9/02118; H03H 9/131;
(Continued)

(56) References Cited

U.S. PATENT DOCUMENTS

| 4,320,365 A | 3/1982 | Black et al. |
| 5,448,014 A | 9/1995 | Kong et al. |

(Continued)

FOREIGN PATENT DOCUMENTS

| JP | 2016140053 A | 8/2016 |
| TW | 200610266 A | 3/2006 |
| WO | WO2020132997 A1 | 7/2020 |

OTHER PUBLICATIONS

Stokes, Notice of Allowance, U.S. Appl. No. 15/789,109, dated Nov. 14, 2019, 11pgs.
(Continued)

*Primary Examiner* — Emily P Pham
(74) *Attorney, Agent, or Firm* — Morgan, Lewis & Bockius LLP

(57) ABSTRACT

A bulk acoustic wave (BAW) resonator includes a substrate, a stack over the substrate and including a piezoelectric layer disposed between two electrode layers, and one or more edge frames. The one or more edge frames can be a raised metal frame extending parallel to a periphery of an active region of the stack and has one or more slanted cuts such that the edge frame does not form a closed loop and loss of acoustic energy in the active region through the one or more cuts is reduced, minimized or prevented. Alternatively or additionally, the one or more edge frames include a recessed edge frame in the form of a trench in the piezoelectric layer extending parallel to a boundary of the active region, and may further include a second edge frame formed on the first electrode and embedded in the piezoelectric layer.

19 Claims, 7 Drawing Sheets

Related U.S. Application Data filed on Oct. 15, 2019, provisional application No. 62/915,573, filed on Oct. 15, 2019, provisional application No. 62/915,581, filed on Oct. 15, 2019.

(51) Int. Cl.
  *H03H 9/17* (2006.01)
  *H10N 30/85* (2023.01)
  *H10N 30/00* (2023.01)

(52) U.S. Cl.
  CPC ........ *H03H 9/02118* (2013.01); *H03H 9/131* (2013.01); *H03H 9/17* (2013.01); *H03H 9/173* (2013.01); *H10N 30/1051* (2023.02); *H10N 30/85* (2023.02)

(58) Field of Classification Search
  CPC ............ H03H 9/17; H03H 9/173; H03H 3/02; H03H 2003/021; H10N 30/1051; H10N 30/85; H10N 30/50; H10N 30/853
  See application file for complete search history.

(56) References Cited

U.S. PATENT DOCUMENTS

| | | | |
|---|---|---|---|
| 5,578,974 | A | 11/1996 | Yang et al. |
| 5,587,620 | A | 12/1996 | Ruby et al. |
| 5,873,153 | A | 2/1999 | Ruby et al. |
| 5,894,647 | A | 4/1999 | Lakin |
| 6,060,818 | A | 5/2000 | Ruby et al. |
| 6,150,703 | A | 11/2000 | Cushman et al. |
| 6,262,637 | B1 | 7/2001 | Bradley et al. |
| 6,278,342 | B1 | 8/2001 | Ella |
| 6,424,237 | B1 | 7/2002 | Ruby et al. |
| 6,693,500 | B2 | 2/2004 | Yang et al. |
| 6,828,713 | B2 | 12/2004 | Bradley et al. |
| 7,327,073 | B2 | 2/2008 | Shearer et al. |
| 7,345,410 | B2 | 3/2008 | Grannen et al. |
| 7,408,428 | B2 | 8/2008 | Larson, III |
| 7,522,018 | B2 | 4/2009 | Milsom et al. |
| 7,737,806 | B2 | 6/2010 | Taniguchi et al. |
| 8,896,395 | B2 | 11/2014 | Burak et al. |
| 9,197,185 | B2 | 11/2015 | Zou et al. |
| 9,246,079 | B2 | 1/2016 | Umeda et al. |
| 9,246,473 | B2 | 1/2016 | Burak et al. |
| 9,374,059 | B1 | 6/2016 | Hurwitz et al. |
| 9,401,692 | B2 | 7/2016 | Burak |
| 9,479,139 | B2 | 10/2016 | Ruby et al. |
| 9,634,643 | B2 | 4/2017 | Shin et al. |
| 9,842,980 | B2 | 12/2017 | Park et al. |
| 10,079,334 | B2 | 9/2018 | Moulard et al. |
| 10,298,197 | B2 | 5/2019 | Lee et al. |
| 10,601,391 | B2 | 3/2020 | Stokes et al. |
| 11,736,088 | B2 * | 8/2023 | Stokes .................. H03H 9/173 310/326 |
| 11,764,750 | B2 | 9/2023 | Hou et al. |
| 2005/0012568 | A1 | 1/2005 | Aigner |
| 2005/0179508 | A1 | 8/2005 | Sato |
| 2007/0001544 | A1 | 1/2007 | Geefay |
| 2010/0019866 | A1 | 1/2010 | Hara et al. |
| 2010/0148637 | A1 | 6/2010 | Satou |
| 2011/0080233 | A1 | 4/2011 | Petit et al. |
| 2011/0227671 | A1 * | 9/2011 | Zhang .................. H04R 31/00 29/25.35 |
| 2011/0298564 | A1 | 12/2011 | Iwashita et al. |
| 2012/0205754 | A1 | 8/2012 | Iwamoto |
| 2013/0049545 | A1 | 2/2013 | Zou et al. |
| 2013/0057115 | A1 | 3/2013 | Saito et al. |
| 2013/0140959 | A1 | 6/2013 | Shin et al. |
| 2014/0125203 | A1 | 5/2014 | Choy et al. |
| 2014/0354109 | A1 | 12/2014 | Grannen et al. |
| 2016/0065171 | A1 | 3/2016 | Ruby et al. |
| 2016/0294354 | A1 | 10/2016 | Saijo et al. |
| 2016/0352309 | A1 | 12/2016 | Xu et al. |
| 2017/0077385 | A1 * | 3/2017 | Stokes ............... H03H 9/02086 |
| 2017/0149405 | A1 | 5/2017 | Kishimoto |
| 2017/0338399 | A1 * | 11/2017 | Kim ..................... H10N 30/067 |
| 2018/0138885 | A1 | 5/2018 | Stokes et al. |
| 2019/0149129 | A1 | 5/2019 | Ueda |
| 2019/0356293 | A1 | 11/2019 | Kim et al. |
| 2020/0028482 | A1 | 1/2020 | Hou et al. |
| 2020/0220520 | A1 | 7/2020 | Stokes et al. |
| 2020/0235718 | A1 * | 7/2020 | Modarres-Zadeh ........................ H03H 9/02007 |
| 2020/0313648 | A1 | 10/2020 | Wang et al. |
| 2020/0389150 | A1 | 12/2020 | Wang et al. |
| 2021/0006220 | A1 | 1/2021 | Schiek et al. |
| 2021/0099156 | A1 * | 4/2021 | Kirkendall ............. H03H 9/175 |
| 2021/0111693 | A1 | 4/2021 | Hou et al. |
| 2021/0111699 | A1 | 4/2021 | Hou et al. |
| 2021/0111701 | A1 | 4/2021 | Hou et al. |
| 2021/0143792 | A1 * | 5/2021 | Pollard ................ H03H 9/0211 |
| 2021/0250012 | A1 | 8/2021 | Hou et al. |
| 2022/0416149 | A1 | 12/2022 | Hou et al. |

OTHER PUBLICATIONS

Wang, Office Action, 16/368, 754, dated Jul. 13, 2022, 7pgs.
Wang, Office Action, U.S. Appl. No. 17/002,498, dated Jul. 12, 2022, 12pgs.
Global Communication Semiconductors, Inc., Restriction Election, U.S. Appl. No. 16/455,627, dated Aug. 19, 2022, 7 pgs.
Yoo et al., Spurious Resonances and Modelling of Composite Resonators, Department of Physics, The Catholic University of America, Washington, D.C., © 1983 IEEE, 3 pgs.
Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.
Working principles and Applications of SAW/FBAR Devices, Taiyo Yuden Navigator, Oct. 2017, 6 pgs.
Global Communication Semiconductors, Inc., CN Office Action, Chinese Application No. 201711127532.1, dated Nov. 22, 2022, 23 pgs.
Global Communication Semiconductors, Inc., U.S. Non-Final Office Action, U.S. Appl. No. 17/071,831, dated Jul. 17, 2023, 12 pgs.
Global Communication Semiconductors, Inc., U.S. Non-Final Office Action, U.S. Appl. No. 16/455,627, dated Dec. 20, 2022, 8 pgs.
Global Communication Semiconductors, Inc., Restriction Election, U.S. Appl. No. 17/071,836, dated Jun. 21, 2023, 7 pgs.
Global Communication Semiconductors, Inc., Restriction Election, U.S. Appl. No. 17/071,810, dated Aug. 9, 2023, 7 pgs.
Global Communication Semiconductors, Inc., U.S. Non-Final Office Action, U.S. Appl. No. 16/820,625, dated Nov. 14, 2022, 10 pgs.
Global Communication Semiconductors, Inc., U.S. Non-Final Office Action, U.S. Appl. No. 17/071,836, dated Aug. 1, 2023, 13 pgs.
Global Communication Semiconductors, Inc., U.S. Final Office Action, U.S. Appl. No. 17/002,498, dated Jun. 7, 2023, 16 pgs.
Global Communication Semiconductors, Inc., U.S. Notice of Allowance, U.S. Appl. No. 16/820,625, dated Apr. 5, 2023, 8 pgs.

* cited by examiner

BULK ACOUSTIC RESONATOR STRUCTURES WITH IMPROVED EDGE FRAMES

RELATED APPLICATIONS

This application claims priority to U.S. Provisional Patent Application No. 62/915,588, filed Oct. 15, 2019, U.S. Provisional Patent Application No. 62/915,573, filed Oct. 15, 2019, U.S. Provisional Patent Application No. 62/915,577, filed Oct. 15, 2019, and U.S. Provisional Patent Application No. 62/915,581, filed Oct. 15, 2019, each which is hereby incorporated by reference in its entirety.

This application is related to U.S. patent application Ser. No. 17/071,810, filed on Oct. 15, 2020, entitled "Bulk Acoustic Wave Resonator with Multilayer Base"; U.S. patent application Ser. No. 17/071,831, filed on Oct. 15, 2020, entitled "Composite Piezoelectric Film and Bulk Acoustic Resonator Incorporating Same"; and U.S. patent application Ser. No. 17/071,836, filed on Oct. 15, 2020, entitled "Bulk Resonator with Symmetrically Positioned Temperature Compensation Layers," each of which is hereby incorporated by reference in its entirety.

TECHNICAL FIELD

The disclosed embodiments relate generally to bulk acoustic wave resonators, and in particular, to bulk acoustic wave resonator structures with edge frames.

BACKGROUND

A bulk acoustic wave (BAW) resonator typically includes a stack formed on a substrate, the stack including a bottom electrode, a top electrode, and a piezoelectric thin film between the bottom electrode and the top electrode. When an oscillating electrical signal is applied between the top and bottom electrodes, the piezoelectric thin film converts the electrical energy of the signal into mechanical energy (or acoustic energy), resulting in longitudinal or shear waves propagating through the stack in a vertical direction (e.g., perpendicular to the electrodes). The waves in the stack are referred to as bulk acoustic waves. The bulk acoustic waves have their primary resonance at frequencies that may be determined by the thicknesses of the piezoelectric film, electrode layers, and any other layers.

To reduce of minimize leakage of acoustic energy generated by the stack into the structure of the resonator, the stack can be acoustically isolated from the substrate. For example, isolation of vertically propagating acoustic waves of the stack can be achieved by forming a cavity or a Bragg reflector below the stack that separates the stack from the substrate on which the stack is formed.

Energy in the stack of a resonator can also be lost through lateral leakage via the resonator edges due to parasitic laterally-propagating acoustic waves (also called plate modes, such as laterally propagating Rayleigh-Lamb waves or shear horizontal waves) that are generated by mode conversion at the resonator's edges. This energy loss mechanism reduces the quality factor or Q value of the resonator.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1A:
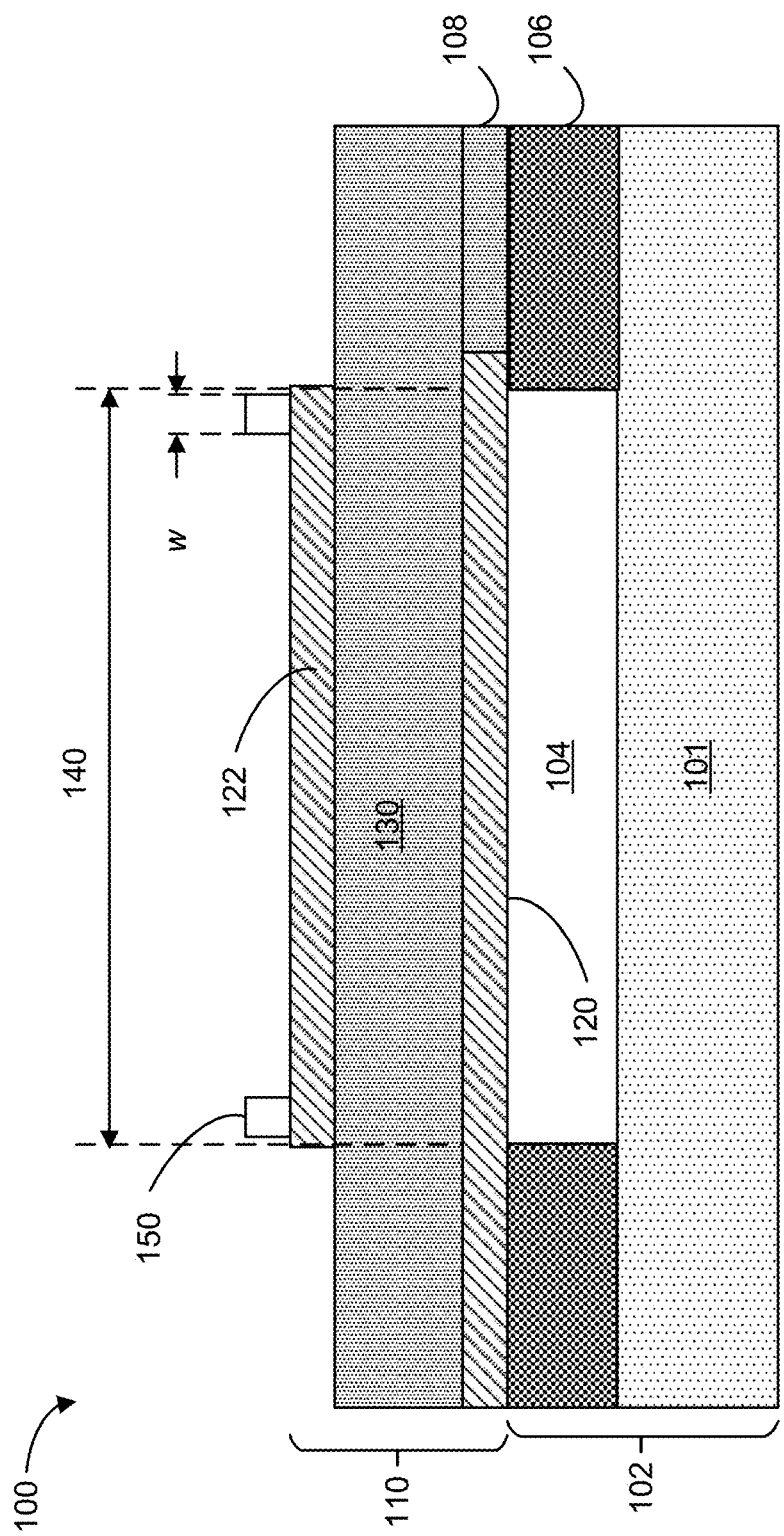
FIG. 1A is a cross-sectional diagram of a bulk acoustic wave resonator, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices with structures for improved performance and manufacturability.

(A1) Some embodiments provide a bulk acoustic resonator, comprising: a substrate; a stack over the substrate, the stack including a first electrode, a second electrode, and a piezoelectric layer between the first electrode and the second electrode; and an edge frame, wherein a region of overlap of the first electrode, the second electrode and the piezoelectric layer forms an active region of the stack, the edge frame is a raised metal frame extending parallel to a periphery of the active region of the stack and has one or more cuts such that the edge frame does not form a closed loop, and each respective cut of the one or more cuts is at a respective location along the periphery of the active region and is slanted with reference to a direction of extension of the edge frame at the respective location so as to reduce loss of acoustic energy in the active region through the respective cut.

(A2) In some embodiments of the bulk acoustic resonator of A1, the substrate includes a cavity and a frame around the cavity; the stack bridges the cavity and is supported by the frame; and the active region is above the cavity.

(A3) In some embodiments of the bulk acoustic resonator of A1, the substrate includes Bragg reflector; and the stack is above the Bragg reflector.

(A4) In some embodiments of the bulk acoustic resonator of any of A1-A3, the respective cut is along a direction that forms a first angle with the direction of extension of the edge frame at the respective location, and the first angle is equal to or less than 45 degrees.

(A5) In some embodiments of the bulk acoustic resonator of any of A1-A4, the respective cut is along a direction that forms a second angle with a direction of propagation of the acoustic energy at the respective location, and wherein the second angle is between 45 degrees and 135 degrees.

(A6) In some embodiments of the bulk acoustic resonator of any of A1-A5, a width of the edge frame is 0.5-10 μm.

(A7) In some embodiments of the bulk acoustic resonator of A6, each of the one or more cuts is narrower than a width of the edge frame.

(A8) In some embodiments of the bulk acoustic resonator of any of A1-A7, the edge frame includes a metal or a dielectric material.

(A9) In some embodiments of the bulk acoustic resonator of any of A1-A8, the edge frame includes a metal selected from the group consisting of Molybdenum (Mo), Tungsten (W), Gold (Au), and Aluminum (Al), or a dielectric material selected from the group consisting of AlN and SiO2.

(A10) In some embodiments of the bulk acoustic resonator of any of A1-A9, the edge frame is 200 Angstroms to 1 μm thick.

(A11) In some embodiments of the bulk acoustic resonator of any of A1-A10, the edge frame is outside the active region and closely aligned with the periphery of the active region.

(A12) In some embodiments of the bulk acoustic resonator of any of A1-A10, the edge frame includes a metal and the bulk acoustic resonator is formed using a process comprising: forming a photoresist mask having one or more openings defining one or more areas corresponding to one or more areas to be occupied by the edge frame, the one or more areas having one or more gaps corresponding to the one or more cuts; depositing the metal in the one or more areas and over the photoresist mask using blanket evaporation; and lifting off the photoresist via the one or more gaps to remove the metal on the photoresist mask such that the metal deposited in the one or more areas remains to form the edge frame.

(A13) In some embodiments of the bulk acoustic resonator of any of A1-A12, the edge frame is formed on top of one of the first and second electrodes.

(A14) In some embodiments of the bulk acoustic resonator of any of A11-A12, the edge frame is disposed within the stack.

(A15) In some embodiments of the bulk acoustic resonator of any of A1-A12, the edge frame is disposed underneath one of the first and second electrodes.

(A16) Some embodiments provide a bulk acoustic resonator, comprising: a substrate; and a stack over the substrate, the stack including a first electrode, a second electrode, and a piezoelectric layer between the first electrode and the second electrode; wherein a region of overlap of the first electrode, the second electrode and the piezoelectric layer forms an active region of the stack; the piezoelectric layer has a trench extending parallel to a boundary of the active region, the trench has an outer sidewall facing the active region surrounded by the trench, an inner sidewall facing the outer sidewall, and a bottom surface; the second electrode extends from a top surface of the piezoelectric layer in the active region to cover the inner sidewall, the bottom surface, and the outer sidewall of the trench; and the trench provides an air gap between a portion of the second electrode on the inner sidewall and a portion of the second electrode on the outer sidewall.

(A17) In some embodiments of the bulk acoustic resonator of A16, the substrate includes a cavity and a frame around the cavity; the stack bridges the cavity and is supported by the frame; and the active region is above the cavity.

(A18) In some embodiments of the bulk acoustic resonator of A16, the substrate includes Bragg reflector; and the stack is above the Bragg reflector.

(A19) In some embodiments of the bulk acoustic resonator of any of A16-A18, the trench is inside the active region.

(A20) In some embodiments of the bulk acoustic resonator of any of A16-A18, the trench is outside the active region.

(A21) In some embodiments of the bulk acoustic resonator of any of A16-A18, a depth of the trench is less than a thickness of the piezoelectric layer.

(A22) In some embodiments of the bulk acoustic resonator of any of A16-A21, the trench is 0.5 μm to 10 μm wide.

(A23) Some embodiments provide a bulk acoustic resonator, comprising: a substrate; a stack over the substrate, the stack including a first electrode, a second electrode, and a piezoelectric layer between the first electrode and the second electrode; and an edge frame on the first electrode and protruding into the piezoelectric layer; wherein a region of overlap of the first electrode, the second electrode and the piezoelectric layer forms an active region of the stack, the piezoelectric layer has a trench extending parallel to a boundary of the active region, and the edge frame extends parallel to the boundary of the active region.

(A24) In some embodiments of the bulk acoustic resonator of A23, the substrate includes a cavity and a frame around the cavity; the stack bridges the cavity and is supported by the frame; and the active region is above the cavity.

(A25) In some embodiments of the bulk acoustic resonator of A23, the substrate includes Bragg reflector; and the stack is above the Bragg reflector.

(A26) In some embodiments of the bulk acoustic resonator of A23, the trench is outside the active region and closely aligned with the boundary of the active region, and wherein the edge frame is also outside the active region.

(A27) In some embodiments of the bulk acoustic resonator of A26, a distance between an outer surface of the trench and an inner surface of the edge frame is less than 10 μm.

(A28) In some embodiments of the bulk acoustic resonator of any of any of A23-A25, the trench is outside the active region and closely aligned with the boundary of the active region, and wherein the edge frame is inside the active region.

(A29) In some embodiments of the bulk acoustic resonator of A28, a distance between an inner surface of the trench and an outer surface of the edge frame is less than 10 μm.

(A30) In some embodiments of the bulk acoustic resonator of any of A23-A29, a depth of the trench is less than a thickness of the piezoelectric layer.

(A31) In some embodiments of the bulk acoustic resonator of any of A23-A30, the trench is 0.5 μm to 10 μm wide.

(A32) In some embodiments of the bulk acoustic resonator of any of any of A23-A31, a top of the edge frame is below a top surface of the piezoelectric layer and above a bottom surface of the trench.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1A is a cross-sectional diagram of a bulk acoustic wave (BAW) resonator 100, in accordance with some embodiments. BAW resonator 100 includes a substrate 102 and a stack 110 that is disposed over the substrate 102. The stack 110 includes a first (or bottom) electrode 120, a second (or top) electrode 122 that is disposed over the first electrode 120, and a piezoelectric layer 130 that is disposed between the first electrode 120 and the second electrode 122. A region of overlap between the first electrode 120 and the second electrode 122 forms or defines an active region 140 of the stack.

In some embodiments, the substrate 102 includes a cavity 104 and a frame 106 around the cavity formed on a base substrate 101, and the stack 110 bridges the cavity 104 and is supported by the frame 106. The active region 140, which is the overlapped region between the top electrode 122 and the bottom electrode 120, is above the cavity 104. Alternatively, instead of the cavity 104 and the frame 106, the substrate 102 may include a Bragg reflector (not shown) formed over the base substrate 101, and the stack 110 is disposed above the Bragg reflector.

Figure 1B:
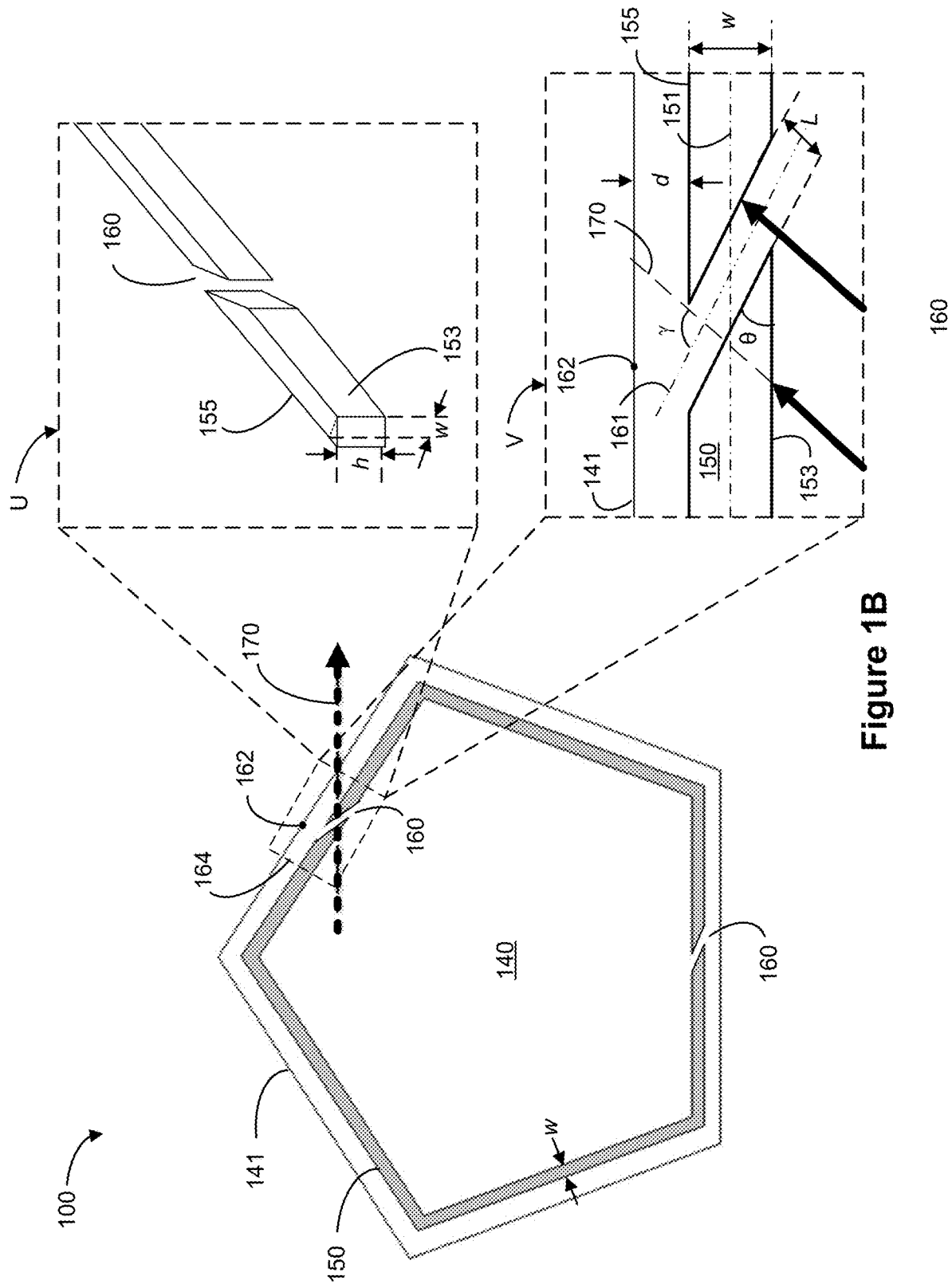
FIG. 1B is a plan view of the bulk acoustic wave resonator shown in FIG. 1A, in accordance with some embodiments.
Figure 4:
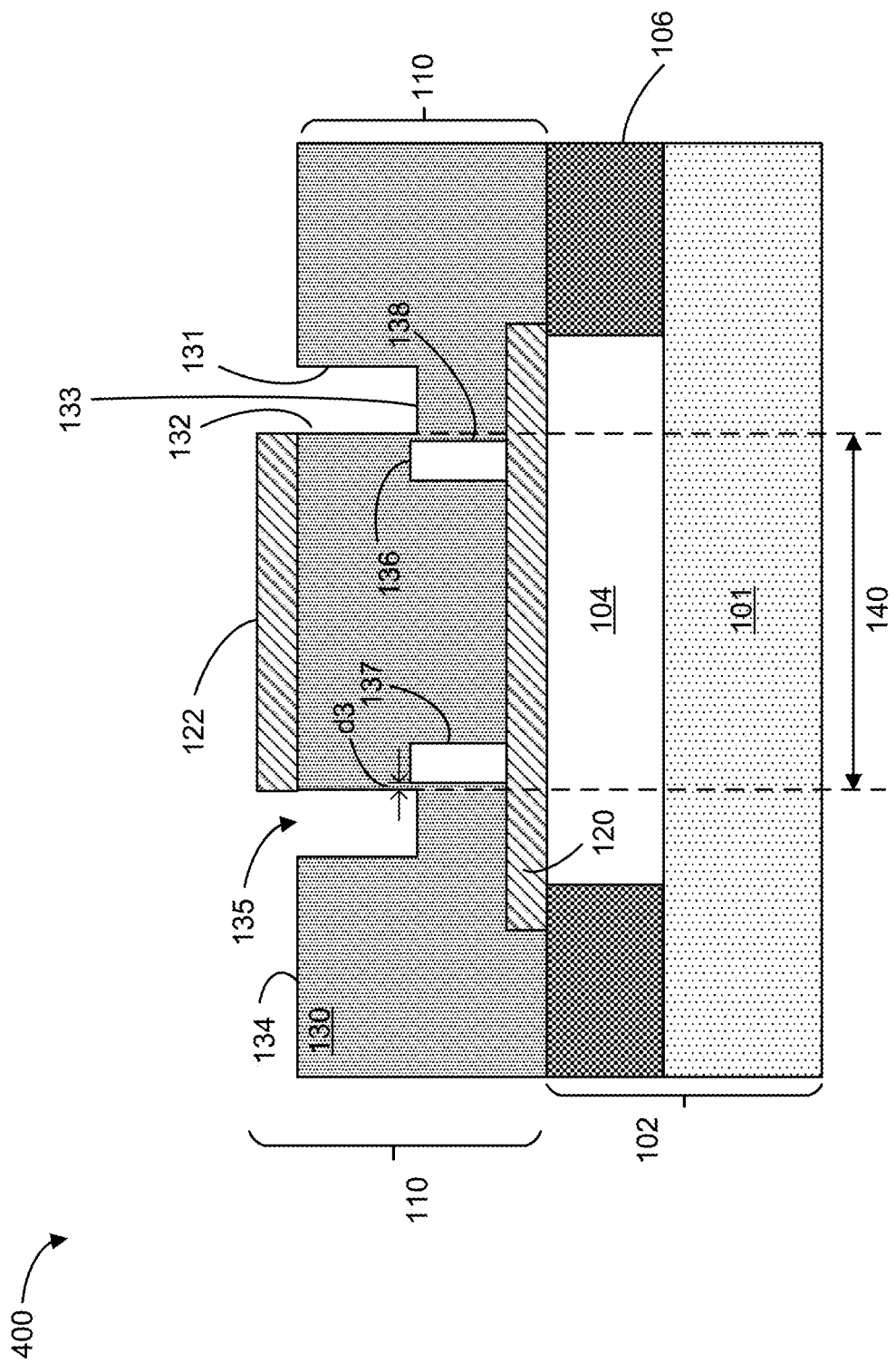
Figure 5:
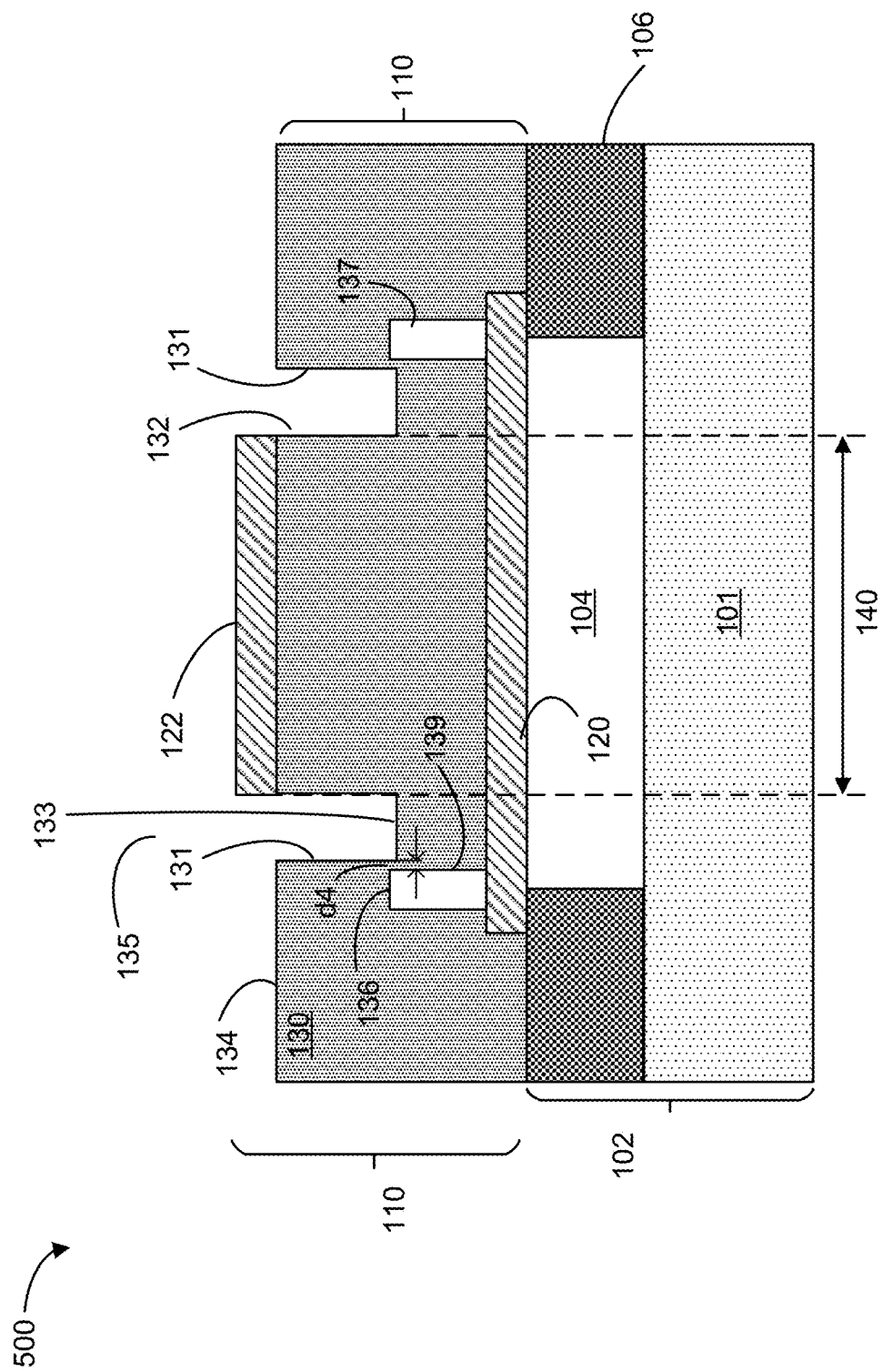

In some embodiments, the resonator 100 further includes an edge frame 150 disposed above the stack 110 (e.g., as shown in FIG. 1A), within (e.g., as shown in FIGS. 4 and 5), or under the stack 110 (not shown). As shown in FIG. 1B, which illustrates a plan view of the resonator 100, in some embodiments, the edge frame 150 extends parallel to a periphery or boundary 141 of the active region 140 of the stack, and has one or more cuts 160 such that the edge frame 150 does not form a closed loop. Each respective cut of the one or more cuts is at a respective location 162 along the periphery 141 of the active region 140 and is slanted with reference to a direction of extension of the edge frame at the respective location so as to prevent, minimize or reduce loss of acoustic energy in the active region 140 through the respective cut (e.g., loss of acoustic energy a through respective slanted cut is reduced by at least 75% relative to a straight-through cut through the edge frame (e.g., at a right angle compared to a primary axis of the edge frame at the position of the cut) having the same width as the respective slanted cut).

Inset U illustrates a perspective view of an area 164 near a respective location 162 of a respective cut 160, showing that the edge frame 150 has a with w and a thickness h. In some embodiments, the width of w of the edge frame 150 (e.g., the distance between an inner surface 153 of the edge frame facing an interior of the active region 140 and an outer surface 155 of the edge frame facing the outside of the active region 140) is about 1-10 μm. In some embodiments, the edge frame 150 is about 200 Angstroms to 1 μm thick. Inset V illustrates a zoomed-in plan view of the area 164, showing a primary axis 151 of the edge frame 150 along a direction of extension of the edge frame 150, and a primary axis 161 of the cut 160. As also shown in Inset V, the primary axis 161 of the cut 160 is angled relative the primary axis 151 of the edge frame 150 at the respective location 162 of the cut, so as to minimize or reduce loss of acoustic energy propagating in a direction 170 from leaking through the respective cut. As shown in FIG. 1B, the acoustic energy propagating in the direction 170 would be blocked by portions of the edge frame 150 on either side of the cut.

As also shown in Inset V, the respective cut 160 is along a direction that forms an angle θ with the direction of extension of the edge frame at the respective location. In some embodiments, the angle θ is equal to or less than 45 degrees. In some embodiments, each of the one or more cuts 160 is narrower than the width w of the edge frame (e.g., a size L of the cut 160, defined by, for example, the distance from a portion of the edge frame 150 on one side of the cut to another portion of the edge frame 150 on the other side of the cut) is less than the width w of the edge frame 150 (L<w). In some embodiments, the location and direction of the cut are designed such that the primary axis 161 of the cut forms an angle γ with the direction of propagation 170 of the acoustic energy in the active region 140, and γ is between 45 degrees and 135 degrees.

In some embodiments, the edge frame 150 includes a metal or a dielectric material. For example, the metal can include Molybdenum (Mo), Tungsten (W), Gold (Au), and/or Aluminum (Al), and the dielectric material can include AlN and/or SiO2.

In some embodiments, the edge frame 150 is inside the active region 140 and closely aligned with the periphery 141 of the active region 140 (e.g., the distance d from the outer surface 155 of the edge frame 150 to the periphery 141 of the active region 140 is less than 20 μm). In some embodiments, the edge frame 150 is outside the active region 140 and closely aligned with the periphery 141 of the active region 140 (e.g., the distance d from the inner surface 153 of the edge frame 150 to the periphery 141 of the active region 140 is less than 20 μm). In some embodiments, the edge frame 150 extends along the periphery 141 of the active region 140 (e.g., the periphery 141 of the active region 140 is between the inner surface 153 and the outer surface 155 of the edge frame 150).

FIG. 1A shows that the edge frame 150 is formed on top of the stack 110 according to some embodiments. The edge frame 150 can also be formed within the stack (e.g., on top of the first electrode 120 and embedded in the piezoelectric layer 130, or under the stack.

Figure 1C:
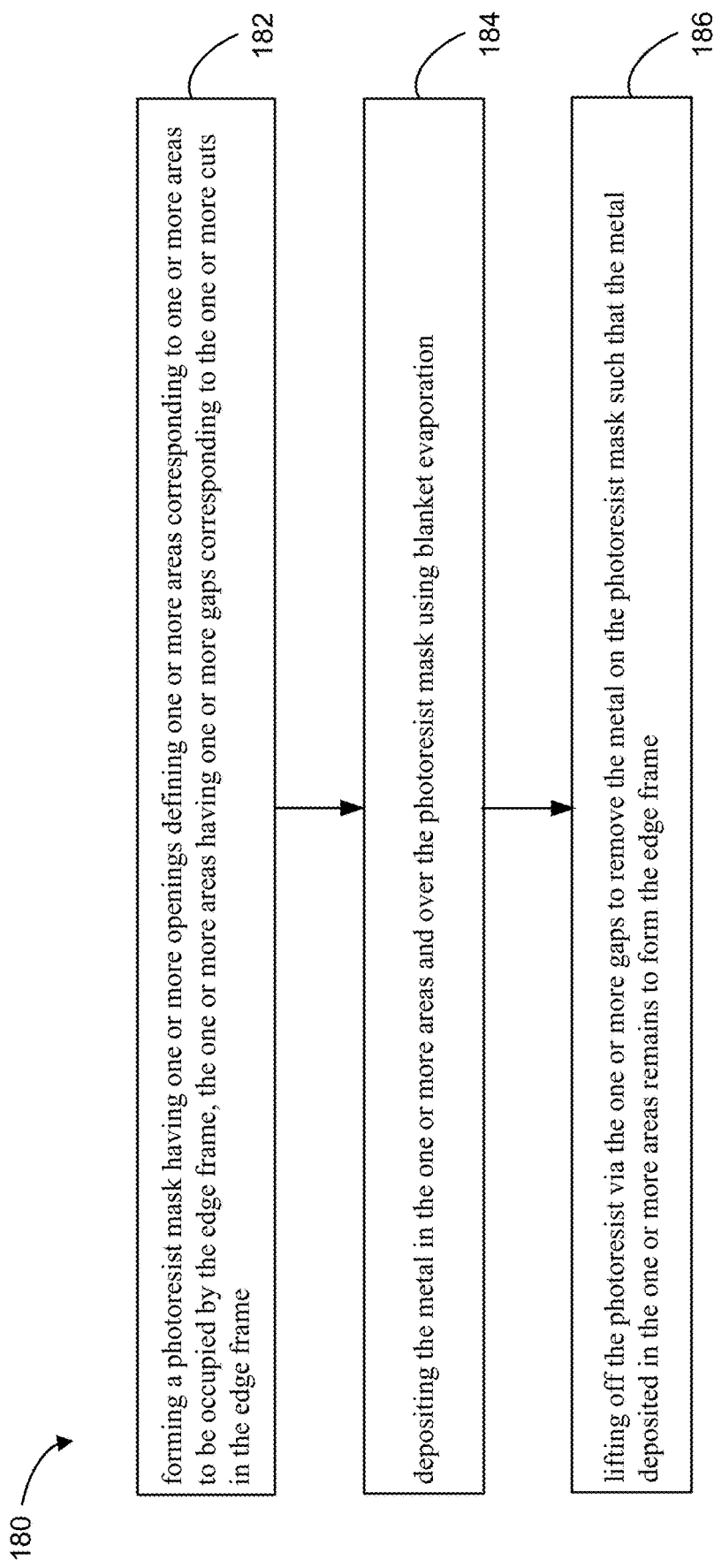
FIG. 1C is a flowchart illustrating a process for forming an edge frame in the bulk acoustic resonator, in accordance with some embodiments.

In some embodiments, the edge frame 150 includes one or more metals and is formed using a lift-off process 180 illustrated in FIG. 1C according to some embodiments. As shown in FIG. 1C, process 180 includes, for example, forming (182) a photoresist mask having one or more openings defining one or more areas corresponding to one or more areas to be occupied by the edge frame 150, as shown in FIG. 1B. In some embodiments, the one or more areas having one or more gaps corresponding to the one or more cuts 160 in the edge frame, as shown in FIG. 1B. In some embodiments, process 180 further includes depositing (184) the one or more metals in the one or more areas and over the photoresist mask using, for example, blanket evaporation, and lifting (186) off the photoresist via the one or more gaps corresponding to the one or more cuts 160 to remove the metal on the photoresist mask. The metal deposited in the one or more areas remains to form the edge frame 150. Thus, the one or more cuts 160 in the edge frame 150 can be used to facilitate lifting off the unwanted metal. This lift-off process does not cause damage to the resonator surface, and is therefore advantageous over conventional method of forming edge frames, which usually includes blanket deposition of the frame material, followed by a patterned etch-removal of the unwanted material inside and outside of the frame. The etch process can cause damage to the surface of the resonator and degrade its performance, especially if the frame material includes a metal. The one or more cuts in the edge frame according to some embodiments make the lift-off process feasible as the lift-off process does not work well with closed-loop edge frame.

Figure 2:
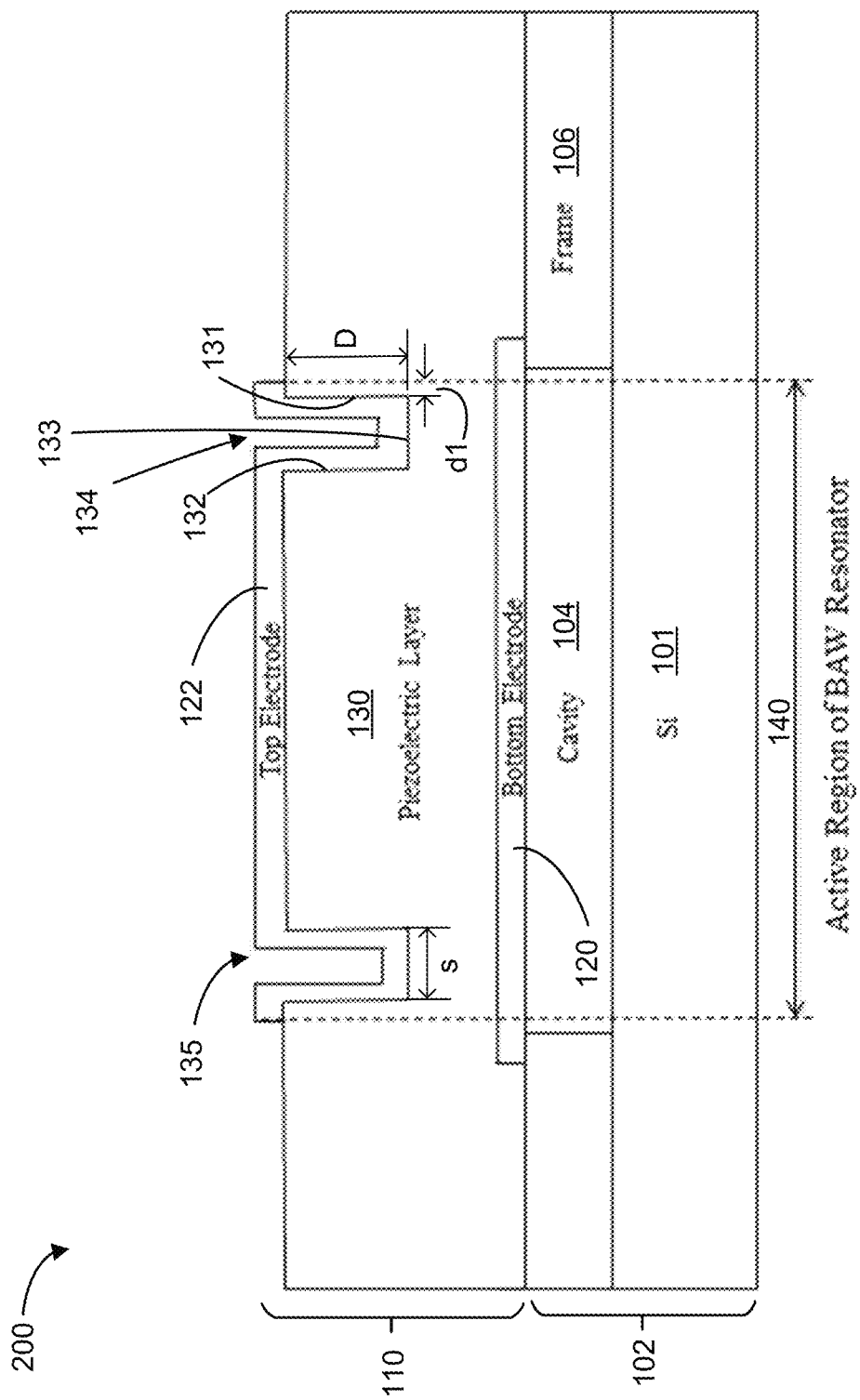
FIGS. 2-5 are cross-sectional diagrams of several bulk acoustic wave resonators, in accordance with some embodiments.

FIG. 2 is a cross-sectional diagram of a bulk acoustic wave (BAW) resonator 200, according to some embodiments. As shown in FIG. 2, the resonator (or resonator) 200 includes a substrate; and a stack over the substrate. The stack includes a bottom electrode, a top electrode, and a piezoelectric layer 130 between the bottom electrode and the top electrode. A region of overlap of the bottom electrode, the second electrode and the piezoelectric layer 130 forms an active region 140 of the resonator 200.

In some embodiments, the piezoelectric layer 130 has a trench extending parallel with a boundary of the active region 140, and the trench 135 is etched into the piezoelectric layer 130 to improve edge reflection. It has an outer sidewall 131 facing an interior of the active region 140 or a portion of the active region 140 surrounded by the trench 135, an inner sidewall 132 facing the outer sidewall, and a bottom surface 133. In some embodiments, the second electrode 122 extends from a top surface of the piezoelectric layer 130 in the active region 140 to cover the inner sidewall 132, the bottom surface 133, and the outer sidewall 131 of the trench 135. In some embodiments, the trench 135 is sufficiently wide to provide or include an air gap 134 between a portion of the second electrode on the inner sidewall and a portion of the second electrode on the outer sidewall. Thus, the trench 135, the portions of the second electrode 122 lining the trench sidewalls 131/132 and the bottom surface 133, and the air gap 134 there-between, together form a recessed edge frame 150 for the resonator 200. The recessed edge frame creates a higher acoustic impedance mismatch between the frame and regions inside and outside of the frame. The impedance mismatch helps to confine the lateral mode acoustic waves.

In some embodiments, as also shown in FIG. 2, the substrate includes a cavity 104 and a frame 106 around the cavity, and the stack 110 bridges the cavity 104 and is supported by the frame 106. The active region 140 is above the cavity 104. Alternatively, instead of the cavity 104 and the frame 106, the substrate includes a Bragg reflector (not shown), and the stack is above the Bragg reflector.

Figure 3:
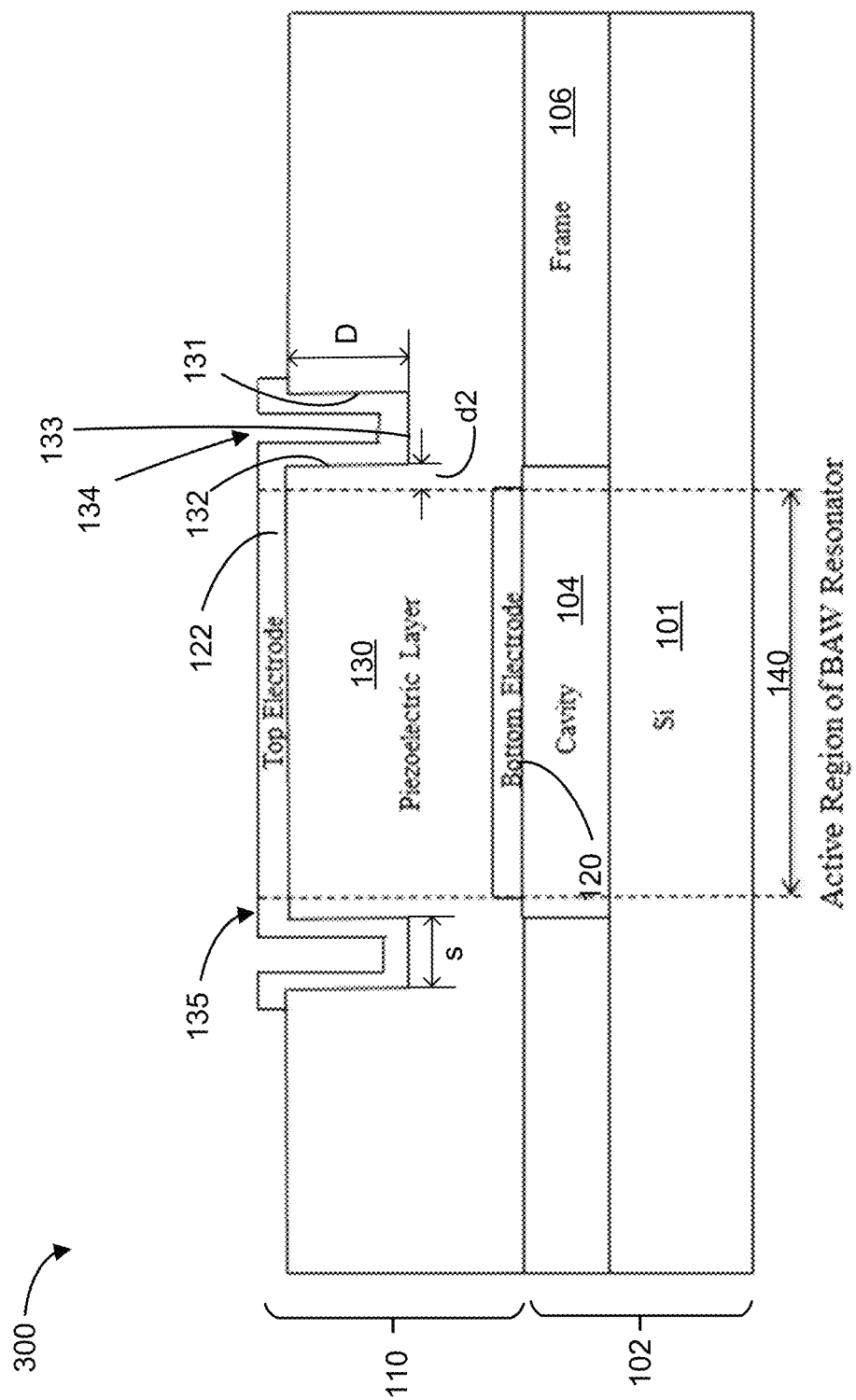

FIG. 2 shows that the trench 135 is inside the active region 140 and closely aligned with the boundary or periphery of the active region 140 (e.g., the distance d1 from the outer sidewall 131 of the trench to the periphery of the active region 140 is less than 5 µm). FIG. 3 is a cross-sectional diagram of a bulk acoustic wave (BAW) resonator 300, according to some embodiments. Resonator 300 corresponds to (e.g., is similar to) resonator 200 except that the trench 135 is outside the active region 140 and closely aligned with the boundary or periphery of the active region 140 (e.g., the distance d2 from the inner sidewall 132 of the trench to the periphery of the active region 140 is less than 5 µm). The structure shown in FIG. 3 helps to prevent the creation of a parasitic resonator with a different resonant frequency, which is a common issue associated with a raised edge frames. A raised frame inside an active region results in a different stack thickness from the main body of the resonator, creating a parasitic resonator with a lower resonance frequency than that of the primary resonator. The same issue may also be associated with a recessed edge frame located inside the active region of the resonator.

In some embodiments, a depth of the trench 135 (e.g., the distance D between a top surface of the piezoelectric layer 130 and the bottom surface of the trench 135) is less than the full thickness of the piezoelectric layer 130. Thus, the trench 135 does not perforate the piezoelectric layer 130 and thus does not compromise the mechanical robustness of the resonator. In some embodiments, the depth of the trench 135 is more than half of the thickness of the piezoelectric layer 130. In some embodiments, the trench 135 is 0.5 µm to 10 µm wide (e.g., the distance s between the inner sidewall 132 and the outer sidewall 131 is 0.5 µm to 10 µm).

FIG. 4 is a cross-sectional diagram of a bulk acoustic wave (BAW) resonator 400, in accordance with some embodiments. The resonator 400 includes a substrate 102, a stack 110 that is disposed over the substrate 102. The stack 110 includes a first (or bottom) electrode 120, a second (or top) electrode 122 that is disposed over the first electrode 120, and a piezoelectric layer 130 that is disposed between the first electrode 120 and the second electrode 122. A region of overlap of the first electrode 120, the second electrode 122, and the piezoelectric layer 130 forms or defines an active region 140 of the stack.

In some embodiments, the substrate 102 includes a cavity 104 and a frame 106 around the cavity, and the stack 110 bridges the cavity 104 and is supported by the frame 106. The active region 140 is above the cavity 104. Alternatively, instead of the cavity 104 and the frame 106, the substrate includes a Bragg reflector (not shown), and the stack 110 is above the Bragg reflector.

In some embodiments, the piezoelectric layer 130 has a trench 135 extending parallel with a boundary of the active region 140, the trench 135 has an outer sidewall 131 facing an interior of the active region 140 or a portion of the active region 140 surrounded by the trench 135, an inner sidewall 132 facing the outer sidewall 131, and a bottom surface 133. The trench 135 provides or includes an air gap between an inner sidewall and the outer sidewall, thus forming a first recessed edge frame for the resonator 400. In some embodiments, the top electrode 122 extends to cover the sidewalls 131/132 and bottom surface 133 of the trench 135, as shown in FIGS. 2 and 3. In some embodiments, the top electrode 122 does not extend to cover the sidewalls 131/132 and bottom surface 133 of the trench 135, as shown in FIG. 4.

In some embodiments, the resonator 400 further includes a second edge frame 137 formed on the bottom electrode and protruding into the piezoelectric layer 130 to form a more complete edge reflector with the recessed edge frame 135. The second edge frame 137 extends parallel to the boundary of the active region 140. As shown in FIG. 4, while the first edge frame (e.g., provided by trench 135) is outside and bordering the active region 140, the second edge frame 137 can be inside the active region 140 and closely aligned with the periphery of the active region 140 or the inner sidewall 132 of the trench 135 (e.g., the distance d3 from an outer surface 138 of the second edge frame 137 and the inner sidewall 132 of the trench 135 is less than 10 µm).

In some embodiments, as shown in FIG. 5, the second edge frame 137 can be outside the active region 140 and closely aligned with the outer sidewall 131 of the trench 135 (e.g., the distance from an inner surface 139 of the second edge frame 137 and the outer sidewall 131 of the trench 135 is less than 10 µm). In some embodiments, the recessed frame 135 and the raised frame 137 can be combined and repeated to be even more effective in minimizing or reducing leakage of acoustic energy in lateral mode acoustic waves. For example, another recessed frame (not shown) outside of the second edge frame 137 can be provided in addition to the first recessed frame 135 and the second edge frame 137.

In some embodiments, each of the edge frame 137 can be formed on the bottom electrode 120 using the process 300 described above with reference to FIGS. 1B and 1C, and can include one or more cuts 160, as described above with reference to FIG. 1B.

In some embodiments, a depth of the trench 135 (distance between the top surface 134 of the piezoelectric layer 130 and the bottom surface 133 of the trench 135) is less than the full thickness of the piezoelectric layer 130. In some embodiments, the depth of the trench 135 is more than half of the thickness of the piezoelectric layer 130.

In some embodiments, the trench 135 is about 0.5 µm to 10 µm wide (e.g., the distance between inner sidewall 132 and outer sidewall 131 of the trench 135 is 0.5 µm to 10 µm).

In some embodiments, a top surface 136 of the second edge frame 137 is below a top surface 134 of the piezoelectric layer 130 and above a bottom surface 133 of the trench 135, in order to more completely block the lateral waves from leaking out of the active region.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising:
    a substrate;
    a stack over the substrate, the stack including a first electrode, a second electrode, and a piezoelectric layer between the first electrode and the second electrode; and
    an edge frame, wherein:
        a region of overlap of the first electrode, the second electrode and the piezoelectric layer forms an active region of the stack;
        the edge frame is a raised metal frame extending parallel to a periphery of the active region of the stack and has one or more cuts such that the edge frame does not form a closed loop; and
        each respective cut of the one or more cuts is at a respective location along the periphery of the active region and is slanted with reference to a direction of extension of the edge frame at the respective location so as to reduce loss of acoustic energy in the active region through the respective cut.

2. The bulk acoustic resonator of claim 1, wherein the substrate includes a Bragg reflector or a cavity surrounded by a frame, and wherein:
    the stack bridges the cavity and is supported by the frame so that the active region is above the cavity; or
    the stack is above the Bragg reflector.

3. The bulk acoustic resonator of claim 1, wherein a respective cut of the one or more cuts is along a direction that forms a first angle with the direction of extension of the edge frame at the respective location, and wherein the first angle is equal to or less than 45 degrees.

4. The bulk acoustic resonator of claim 1, wherein a respective cut of the one or more cuts is along a direction that forms a second angle with a direction of propagation of the acoustic energy at the respective location, and wherein the second angle is between 45 degrees and 135 degrees.

5. The bulk acoustic resonator of claim 1, wherein a width of the edge frame is 0.5-10 µm, and wherein each of the one or more cuts is narrower than a width of the edge frame.

6. The bulk acoustic resonator of claim 1, wherein the edge frame includes a metal selected from the group consisting of Molybdenum (Mo), Tungsten (W), Gold (Au), and Aluminum (Al), or a dielectric material selected from the group consisting of AlN and $SiO_2$.

7. The bulk acoustic resonator of claim 1, wherein the edge frame is 200 Angstroms to 1 µm thick.

8. The bulk acoustic resonator of claim 1, wherein the edge frame is formed on top of one of the first and second electrodes, and wherein the edge frame is inside or outside the active region and closely aligned with the periphery of the active region.

9. The bulk acoustic resonator of claim 1, wherein the edge frame includes a metal and is formed using a process comprising:
    forming a photoresist mask having one or more openings defining one or more areas corresponding to one or more areas to be occupied by the edge frame, the one or more areas having one or more gaps corresponding to the one or more cuts;
    depositing the metal in the one or more areas and over the photoresist mask using blanket evaporation; and
    lifting off the photoresist via the one or more gaps to remove the metal on the photoresist mask such that the metal deposited in the one or more areas remains to form the edge frame.

10. A bulk acoustic resonator, comprising:
    a substrate; and
    a stack over the substrate, the stack including a first electrode, a second electrode, and a piezoelectric layer between the first electrode and the second electrode; wherein:
        a region of overlap of the first electrode, the second electrode and the piezoelectric layer forms an active region of the stack;
        the piezoelectric layer has a trench extending parallel to a boundary of the active region, the trench has an outer sidewall facing the active region surrounded by the trench, an inner sidewall facing the outer sidewall, and a bottom surface;
        the second electrode extends from a top surface of the piezoelectric layer in the active region to cover the inner sidewall, the bottom surface, and the outer sidewall of the trench; and
        the trench provides an air gap between a portion of the second electrode on the inner sidewall and a portion of the second electrode on the outer sidewall.

11. The bulk acoustic resonator of claim 10, wherein the substrate includes a Bragg reflector or a cavity surrounded by a frame, and wherein:
the stack bridges the cavity and is supported by the frame so that the active region is above the cavity; or
the stack is above the Bragg reflector.

12. The bulk acoustic resonator of claim 10, wherein the trench is inside or outside the active region.

13. The bulk acoustic resonator of claim 10, wherein a depth of the trench is less than a thickness of the piezoelectric layer, and wherein the trench is 0.5 µm to 10 µm wide.

14. A bulk acoustic resonator, comprising:
a substrate;
a stack over the substrate, the stack including a first electrode, a second electrode, and a piezoelectric layer between the first electrode and the second electrode; and
an edge frame on the first electrode and protruding into the piezoelectric layer; wherein:
a region of overlap of the first electrode, the second electrode and the piezoelectric layer forms an active region of the stack;
the piezoelectric layer has a trench extending parallel to a boundary of the active region; and
the edge frame extends parallel to the boundary of the active region,
wherein a top of the edge frame is below a top surface of the piezoelectric layer and above a bottom surface of the trench.

15. The bulk acoustic resonator of claim 14, wherein the substrate includes a Bragg reflector or a cavity surrounded by a frame, and wherein:
the stack bridges the cavity and is supported by the frame so that the active region is above the cavity; or
the stack is above the Bragg reflector.

16. The bulk acoustic resonator of claim 14, wherein the trench is outside the active region and closely aligned with the boundary of the active region.

17. The bulk acoustic resonator of claim 16, wherein the edge frame is outside the active region, and wherein a distance between an outer surface of the trench and an inner surface of the edge frame is less than 10 µm.

18. The bulk acoustic resonator of claim 16, wherein the edge frame is inside the active region, and wherein a distance between an inner surface of the trench and an outer surface of the edge frame is less than 10 µm.

19. The bulk acoustic resonator of claim 14, wherein a depth of the trench is less than a thickness of the piezoelectric layer, and wherein the trench is 0.5 µm to 10 µm wide.

* * * * *